US006178109B1

United States Patent
Song et al.

(10) Patent No.: US 6,178,109 B1
(45) Date of Patent: Jan. 23, 2001

(54) INTEGRATED CIRCUIT MEMORY DEVICES HAVING REDUCED SUSCEPTIBILITY TO REFERENCE VOLTAGE SIGNAL NOISE

(75) Inventors: Ho-sung Song, Seoul; Jei-hwan Yoo, Kyungki-do, both of (KR)

(73) Assignee: Samsung Electronics Co., Ltd. (KR)

( * ) Notice: Under 35 U.S.C. 154(b), the term of this patent shall be extended for 0 days.

(21) Appl. No.: 09/457,511

(22) Filed: Dec. 8, 1999

(30) Foreign Application Priority Data

Dec. 9, 1998 (KR) .................................................. 98-53936

(51) Int. Cl.[7] .............................. G11C 13/00; G11C 11/24
(52) U.S. Cl. ...................... 365/149; 365/189.09; 365/206
(58) Field of Search .............................. 365/149, 189.01, 365/189.08, 189.09, 206

(56) References Cited

U.S. PATENT DOCUMENTS 4,025,907 * 5/1977 Karp .................................. 365/189.01
4,831,591 * 5/1989 Imazeki ............................ 365/189.08

* cited by examiner

Primary Examiner—Terrell W. Fears
(74) Attorney, Agent, or Firm—Myers Bigel Sibley & Sajovec

(57) ABSTRACT

Integrated circuit memory devices include one or more input receivers that have a reference voltage input terminal. A conductor electrically couples the reference voltage input terminals to a reference voltage, and a capacitor is connected between the conductor and a first ground voltage. Preferably, the location of the connection between the capacitor and the conductor is selected in accordance with the electrical characteristics of the input receivers. Accordingly, the capacitor may reduce fluctuations or noise in the reference voltage applied to the reference voltage input terminals of the input receivers. The fluctuations or noise in the reference voltage may cause the input characteristics and/or the set-up and hold times of the input receivers to vary with respect to one another. A reduction in fluctuations or noise in the reference voltage may result in more consistent input characteristics among the input receivers and more consistency in the set-up and hold times.

26 Claims, 3 Drawing Sheets

INTEGRATED CIRCUIT MEMORY DEVICES HAVING REDUCED SUSCEPTIBILITY TO REFERENCE VOLTAGE SIGNAL NOISE

CROSS REFERENCE TO RELATED APPLICATION

This application claims the benefit of Korean Patent Application No. 98-53936, filed Dec. 9, 1998, the disclosure of which is hereby incorporated herein by reference.

FIELD OF THE INVENTION

The present invention relates generally to the field of integrated circuit memory devices, and, more particularly, to noise suppression in high-speed integrated circuit memory devices, such as a Rambus dynamic random access memory (RDRAM) device.

BACKGROUND OF THE INVENTION

Improvements in both speed and functionality of central processing units (CPUs) have generally resulted in accompanying improvements in memory devices to support the operation of these improved CPUs. One example of a memory device that has been designed to provide higher data processing speeds than conventional dynamic random access memories (DRAMs) is the Rambus DRAM (RDRAM). The Rambus DRAM typically includes a plurality of input receivers for converting the voltage level of an external data signal to a level suitable for circuitry internal to the Rambus DRAM. Each of the plurality of input receivers typically includes a differential amplifier for comparing the voltage level of the input data signal with a reference voltage. The differential amplifier generally includes a first NMOS transistor, which is gated by the input data signal, and a second NMOS transistor, which is gated by the reference voltage. When the input receivers operate simultaneously, an overlap capacitance may develop between the gate and the drain of the second NMOS transistor. As the overlap capacitance increases, the reference voltage may fluctuate to levels at which the plurality of input receivers may malfunction.

The fluctuation in the reference voltage may be characterized as noise impressed upon the reference voltage. In general, the noise level increases with distance from the source of the reference voltage. Thus, those input receivers positioned more distant from the location at which the reference voltage is applied may experience greater noise levels. An increase in the noise level may cause the input characteristics to differ between the various input receivers. Accordingly, different input receivers may yield different outputs for the same input data signal because of differences in the reference voltage level applied to the different input receivers caused by the noise.

In addition, the data set-up and hold times may also differ among the various input receivers. The input receivers typically operate in synchronization with a clock signal. The set-up time denotes the amount of time for which data must be input to an input receiver before the clock signal is transitioned while the hold time denotes the amount of time for which data must be continuously held after the clock signal is transitioned. Unfortunately, the input receivers may experience increasing margin loss in set-up time and hold time as their distance increases from the location at which the reference voltage is applied, which may cause the Rambus DRAM to malfunction.

Consequently, there exists a need for integrated circuit memory devices having improved immunity from reference voltage signal noise.

SUMMARY OF THE INVENTION

Certain objects, advantages, and features of the invention may be set forth in the description that follows and may become apparent to those skilled in the art upon examination of the following or may be learned with the practice of the invention.

These and other objects, advantages, and features of the present invention may be provided by integrated circuit memory devices that include an input receiver having a reference voltage input terminal. A conductor electrically couples the reference voltage input terminal to a reference voltage, and a capacitor is connected between the conductor and a first ground voltage. Preferably, the location of the connection between the capacitor and the conductor is selected in accordance with the electrical characteristics of the input receivers. The capacitor may serve as a filter to suppress fluctuations in a reference voltage applied to the reference voltage input terminals, which may cause the input receivers to malfunction.

In accordance with another aspect of the present invention, the integrated circuit memory devices may include a plurality of input receivers with each input receiver having a reference voltage input terminal that is coupled to the reference voltage by the conductor.

In accordance with another aspect of the present invention, a plurality of capacitors may be used to suppress the fluctuations in the reference voltage by connecting a capacitor between each of the plurality of reference voltage input terminals and the first ground voltage.

In accordance with yet another aspect of the present invention, the integrated circuit memory devices include a delay locked loop circuit that is responsive to a first clock signal and generates a second clock signal having a predetermined duty cycle. The input receivers are connected to a second ground voltage and are responsive to the second clock signal.

In accordance with still another aspect of the present invention, the second ground voltage has a magnitude that exhibits greater variability than a magnitude of the first ground voltage.

In accordance with still another aspect of the present invention, an input receiver preferably comprises a level shifter, which is responsive to an input data signal and the reference voltage, and a static cell that generates an output data signal at a logic level opposite that of the input data signal. An amplifier and a capacitance fixing circuit are preferably used to couple the level shifter to the static cell. The level shifter may be implemented as a differential comparator circuit.

In accordance with yet another aspect of the present invention, the capacitors connected between the conductor and the first ground voltage are metal oxide semiconductor (MOS) capacitors and the integrated circuit memory devices are Rambus dynamic random access memory (RDRAM) devices.

The present invention, therefore, may be used to suppress fluctuations or noise in a reference voltage applied to the reference voltage input terminals of the input receivers. The fluctuations or noise in the reference voltage may cause the input characteristics and/or the set-up and hold times of the input receivers to vary with respect to one another. Advantageously, a reduction in fluctuations or noise in the reference voltage may result in more consistent input characteristics among the input receivers and more consistency in the set-up and hold times.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
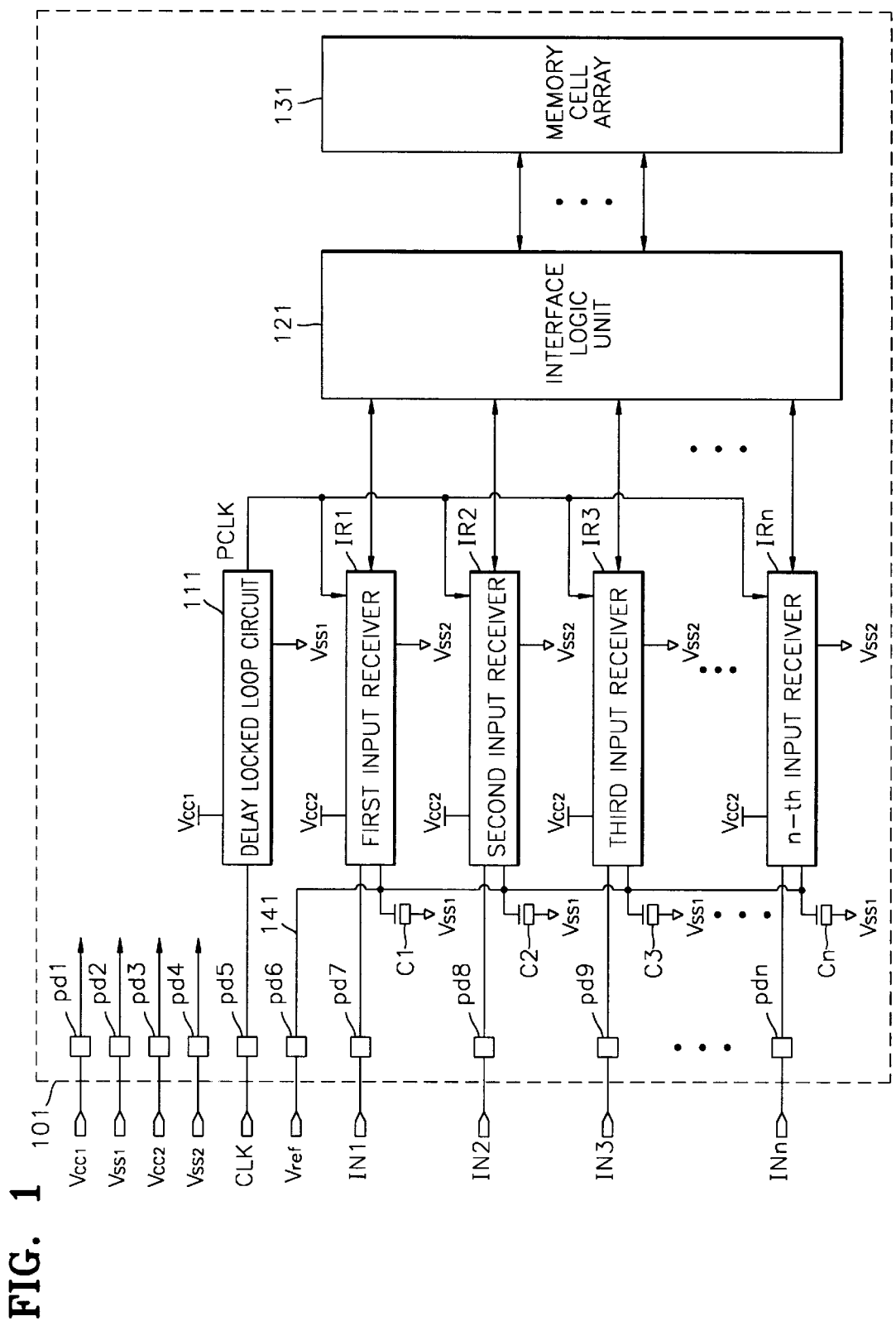
FIG. 1 is a block diagram that illustrates integrated circuit memory devices in accordance with a preferred embodiment of the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

With reference to FIG. 1, a preferred embodiment of an integrated circuit memory device in accordance with the present invention will be described hereafter. An integrated circuit memory device 101 preferably comprises a Rambus dynamic random access memory (RDRAM) that includes a plurality of pads pd1 through pdn, one or more input receivers IR1 through IRn, a plurality of capacitors C1 through Cn, a delay locked loop circuit 111, an interface logic unit 121, and a memory cell array 131. The capacitors C1 through Cn are preferably metal oxide semiconductor (MOS) capacitors.

A first power supply voltage Vcc1, a first ground voltage Vss1, a second power supply voltage Vcc2, and a second ground voltage Vss2 are provided from sources external to the integrated circuit memory device 101 via pads pd1 through pd4. Note that the first and second ground voltages Vss1 and Vss2 are used as reference voltages in the integrated circuit memory device 101 and may, for example, be level shifted to either positive or negative levels. A reference voltage Vref may be provided from an external source via pad pd6, or, alternatively, the reference voltage Vref may be generated and provided by the integrated circuit memory device 101.

The delay locked loop circuit 111 generates an internal clock signal PCLK in response to an external clock signal CLK received via pad pd5. More specifically, the delay locked loop circuit 111 generates the internal clock signal PCLK by modifying the external clock signal CLK, if necessary, so that it has a duty cycle of about 50%. That is, if the external clock signal CLK has a duty cycle that deviates from about 50%, then the phase locked loop circuit 111 "corrects" the duty cycle of the external clock signal CLK to about 50% and outputs the corrected external clock signal as the internal clock signal PCLK. On the other hand, if the external clock signal CLK has a duty cycle of about 50%, then the phase locked loop circuit 111 outputs the external clock signal CLK as the internal clock signal PCLK. The first power supply voltage Vcc1 and the first ground voltage Vss1 are applied to the delay locked loop circuit 111.

The input receivers IR1 through IRn receive input data signals IN1 through INn through respective input data terminals. The input data signals may be provided from an external source via pads pd7 through pdn. The input receivers IR1 through IRn also receive the reference voltage Vref through respective reference voltage input terminals. The input receivers IR1 through IRn convert the voltage levels of the input data signals IN1 through INn to voltage levels suitable for the interface logic unit 121 and the memory cell array 131 in synchronization with the internal clock signal PCLK. The second power supply voltage Vcc2 and the second ground voltage Vss2 are applied to the input receivers IR1 through IRn.

As shown in FIG. 1, a plurality of MOS capacitors C1 through Cn are connected to a conductor (e.g., a metal line) 141. Each of the MOS capacitors C1 through Cn preferably comprises an NMOS transistor. The gate of the NMOS transistor is used as a first electrode, and the source and the drain thereof are connected together and used as a second electrode. Each of the MOS capacitors C1 through Cn may, alternatively, comprise a PMOS transistor or other suitable device. The conductor 141 electrically couples the reference voltage input terminals to each other with the MOS capacitors C1 through Cn being connected between the respective reference voltage input terminals and the first ground voltage Vss1.

The MOS capacitors C1 through Cn are preferably connected to the first ground voltage Vss1 rather than the second ground voltage Vss2. The second ground voltage Vss2 may vary across a wider range than the first ground voltage Vss1. If the MOS capacitors C1 through Cn are connected to the second ground voltage Vss2, then the variation of the second ground voltage Vss2 may be coupled to the reference voltage Vref, which may degrade the operation of the input receivers IR1 through IRn. In addition, although both the delay locked loop circuit 111 and the MOS capacitors C1 through Cn use the first ground voltage Vss1 as a reference potential, the reference potential level at the second electrodes of the MOS capacitors C1 through Cn preferably has a stability that is greater than or equal to the stability of the reference potential level at the delay locked loop circuit 111.

While FIG. 1 shows a MOS capacitor connected between each of the reference voltage input terminals of the input receivers IR1 through IRn and the first ground voltage Vss1, the plurality of MOS capacitors C1 through Cn may be replaced by a single capacitor (e.g., a MOS capacitor) connected between the conductor 141 and the first ground voltage Vss1. The location of the connection between the conductor 141 and the capacitor is preferably selected in accordance with the electrical characteristics (e.g., susceptibility to developing overlap capacitance) of the input receivers IR1 through IRn.

The interface logic unit 121 stores data received from the input receivers IR1 through IRn in a memory cell array 131, and transmits the data received from the memory cell array 131 to the input receivers IR1 through IRn.

Figure 3:
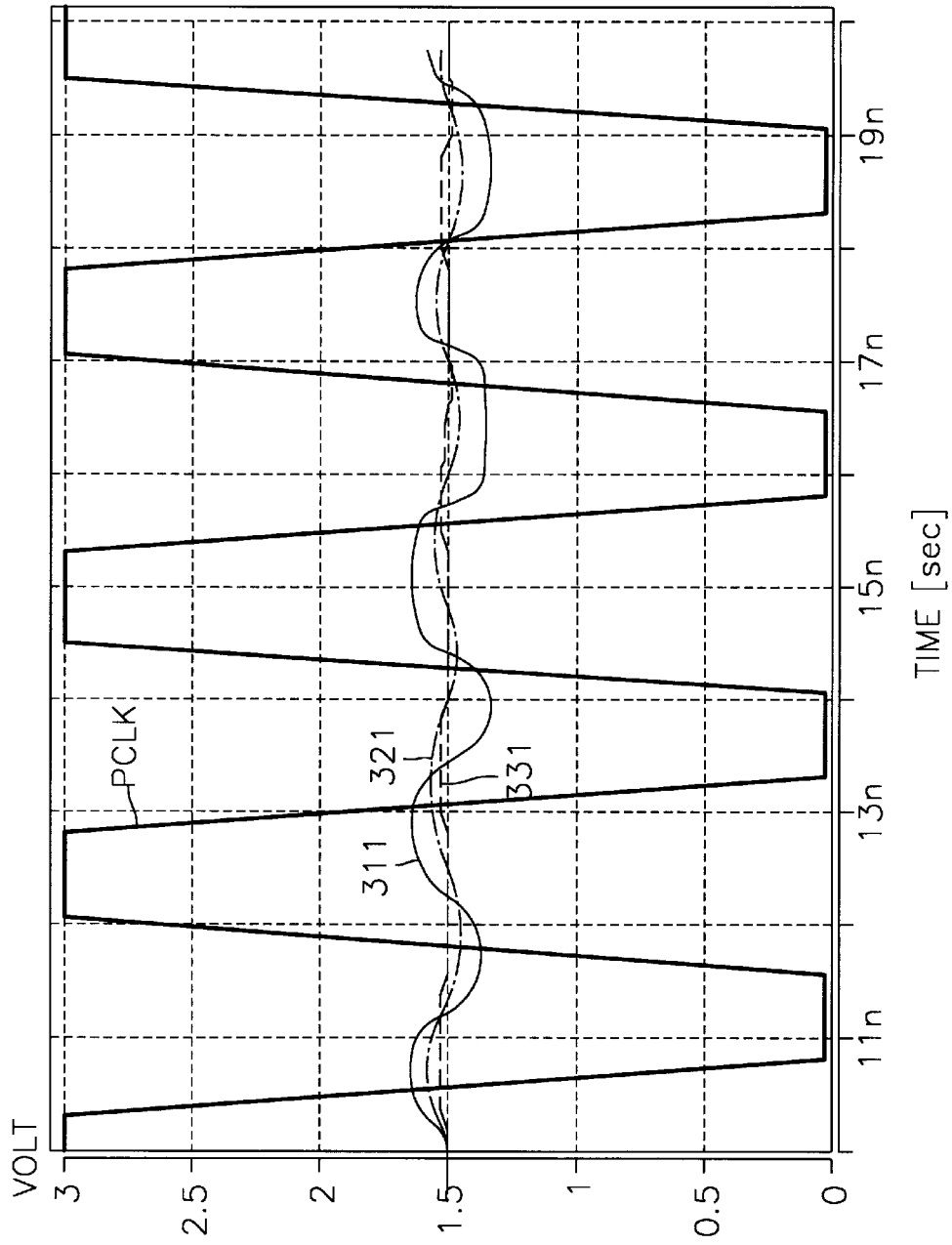
FIG. 3 is a graph that illustrates reference voltage waveforms measured on a prior art integrated circuit memory device and an integrated circuit memory device of FIG. 1.

Thus, in accordance with the present invention, at least one capacitor may be connected to the conductor 141 to suppress fluctuations or noise in the reference voltage Vref. More specifically, the capacitor or capacitors may act as a filter by shunting the noise to ground so that the noise bypasses the input receivers IR1 through IRn. This is illustrated, for example, in FIG. 3 where waveform 331 corresponds to the reference voltage Vref with the capacitors C1 through Cn connected between the conductor 141 and the ground voltage Vss1 while waveform 311 corresponds to the reference voltage Vref with the capacitors C1 through Cn removed from the integrated circuit memory device 101. As can be seen in FIG. 3, the fluctuation in the reference voltage Vref may cause the input characteristics to differ between the various input receivers IR1 through IRn. That is, different input receivers may yield different outputs for the same input data signal because of differences in the reference voltage level Vref applied to the different input receivers caused by the noise. As the noise level is reduced or the vibration amplitude of the reference voltage Vref decreases, the magnitude of the reference voltage Vref applied to each of the input receivers IR1 through IRn may become more uniform and, accordingly, the input characteristics of the input receivers IR1 through IRn may become more uniform. The margin losses in set-up time and hold time may also be reduced, particularly for those input receivers that are located farther away from the source of the reference voltage Vref at pad pd6 (e.g., the n-th input receiver IRn). Moreover, the differences in the set-up and hold times between the input receivers IR1 through IRn may also be reduced.

It should be understood that the principles of the present invention are not limited to Rambus DRAM devices, but may be applied to other integrated circuit devices that include input receivers for converting the voltage levels of input data signals to levels suitable for other circuitry by comparing the input data signals with a reference voltage.

Figure 2:
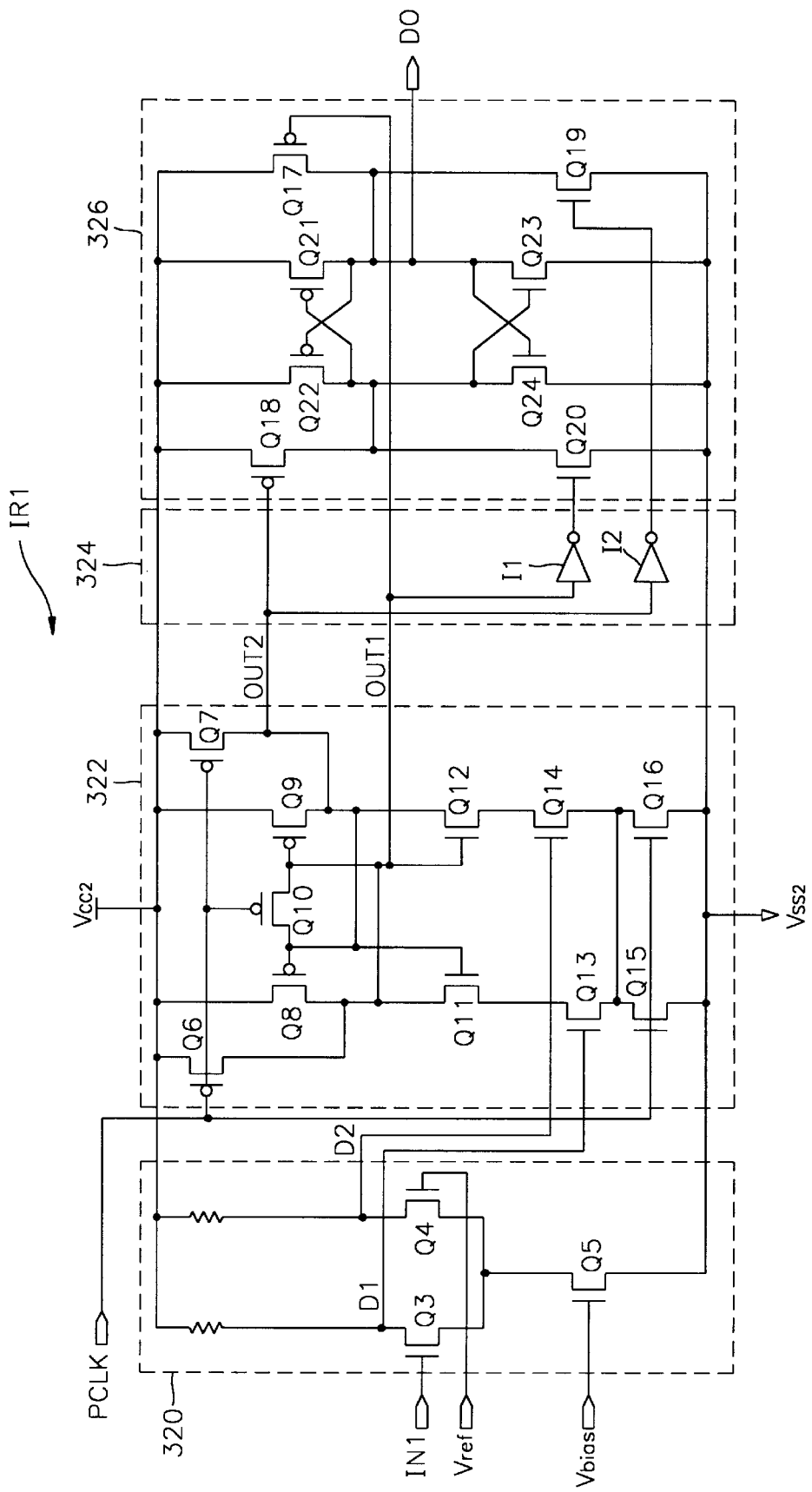
FIG. 2 is a circuit schematic that illustrates a preferred embodiment of an input receiver shown in FIG. 1.

FIG. 2 is a circuit schematic that illustrates a preferred embodiment of the first input receiver IR1 shown in FIG. 1. The input receivers IR1 through IRn preferably have the same structure and operation; therefore, the first input receiver IR1 will be described as a representative. Referring to FIG. 2, the first input receiver IRi includes a level shifter 320, a main amplifier 322, a capacitance fixing circuit 324, and a static cell 326.

The level shifter 320 receives the input data signal IN1, which has a small swing or peak-to-peak amplitude, compares the input data signal IN1 with a reference voltage Vref, and outputs signals D1 and D2 at complementary voltage levels. The level shifter 320 is configured as a conventional differential comparator. A transistor Q5 operates as an active load (e.g., a current source) for the differential comparator and allows a predetermined current to flow into the differential comparator. When the input data signal IN1 voltage level is greater than the reference voltage Vref, the drain current of transistor Q3 is greater than the drain current of transistor Q4. Thus, the voltage level of signal D1 is less than the voltage level of signal D2. On the other hand, when the input data signal IN1 voltage level is less than the reference voltage Vref, the drain current of transistor Q3 is less than the drain current of transistor Q4. Thus, the voltage level of signal D1 is greater than the voltage level of signal D2.

The main amplifier 322 receives the signals D1 and D2 from the level shifter 320 at the rising edge of the internal clock signal PCLK, amplifies the received signals D1 and D2, and outputs amplified signals OUT1 and OUT2. The main amplifier 322 is configured as a differential amplifier, which operates in synchronization with the internal clock signal PCLK. When the internal clock signal PCLK is at a low level, the transistors Q6, Q7, and Q10 are all turned on to precharge the amplified signals OUT1 and OUT2 to "high" logic levels. When the internal clock signal PCLK shifts to a high level, transistors Q15 and Q16 are turned on. One of the transistors Q13 and Q14 is also turned on according to the states of the signals D1 and D2, which causes one of the transistors Q11 and Q12 to turn on.

If the voltage level of signal D1 is greater than the voltage level of signal D2, then the transistor Q13 is turned on faster than the transistor Q14, and the drain voltage of the transistor Q11 is pulled down faster than the drain voltage of the transistor Q12. The voltage levels at the drains of the transistors Q11 and Q12 are generally stabilized by the operations of the transistors Q8 through Q10. The drain voltage levels of the transistors Q11 and Q12 are output as the amplified signals OUT1 and OUT2. When the input data signal IN1 is at a "low" logic level, the signals OUT1 and OUT2 have "low" and "high" logic levels, respectively. Conversely, when the input data signal IN1 is at a "high" logic level, the signals OUT1 and OUT2 have "high" and "low" logic levels, respectively.

The capacitance fixing circuit 324, which is used to match the static cell 326 to the output port of the main amplifier 322, includes inverters I1 and I2. The inverter I1 inverts and outputs the signal OUT1 and the inverter I2 inverts and outputs the signal OUT2.

The static cell 326 receives the signals OUT1 and OUT2 from the main amplifier 322, stores the received signals, and outputs the stored signals as output data D0. When the signals OUT1 and OUT2 are pre-charged to "high" logic levels, transistors Q17 through Q20 are all turned off. When one of the OUT1 and OUT2 signals changes to a "low" logic level after the internal clock signal PCLK shifts to a "high" logic level, one of the transistors Q17 and Q18 turns on and one of the transistors Q19 and Q20 turns on. As a result, data is stored in a memory cell comprising transistors Q21 through Q24. The output data DO of the static cell 326 has a logic level opposite that of the input data signal IN1.

The output data DO of the static cell 326 may be inverted by an inverter (not shown) and provided to a circuit connected thereto. If the input data signal IN1 is real data, then the output data D0 of the static cell 326 is stored in a memory cell designated by an address path. If the input data signal IN1 is a control signal, then the output data D0 is provided to a circuit that uses the control signal.

The waveforms of reference voltages measured on a prior art integrated circuit memory device and the integrated circuit memory device 101 of FIG. 1 will be described hereafter. As shown in FIG. 3, the reference voltage Vref has an ideal level (i.e., unaffected by noise) of approximately 1.5V and the internal clock signal PCLK ranges from approximately 0 to 3V. When the MOS capacitors C1 through Cn are not connected to the conductor 141, the vibration amplitude of the reference voltage 311 (i.e., noise level) is relatively large. When the MOS capacitors C1 through Cn are connected to the metal line 141 in accordance with the present invention, however, the vibration amplitude of the reference voltage 331 is relatively small. When the MOS capacitors C1 through Cn and the input receivers IR1 through IRn are connected to the same ground voltage (i.e., when ground voltages Vss1 and Vss2 are the same), the vibration amplitude of the reference voltage 321 is smaller than the vibration amplitude of the reference voltage 311, but greater than the vibration amplitude of the reference voltage 331.

The principles of the invention have been illustrated herein as they are applied to a Rambus DRAM device. From the foregoing, it can readily be seen that noise or fluctuations in a reference voltage Vref may be reduced by connecting one or more capacitors between a conductor 141, which provides the reference voltage Vref to the input receivers IR1 through IRn, and a stable ground voltage. The fluctuations or noise in the reference voltage Vref may cause the input characteristics and/or the set-up and hold times of the input receivers IR1 through IRn to vary with respect to one another. Advantageously, a reduction in fluctuations or noise in the reference voltage Vref may result in more consistent input characteristics among the input receivers and more consistency in the set-up and hold times.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

We claim:

1. An integrated circuit memory device, comprising:
   a memory cell array;
   an input receiver that is configured to receive data for storage in the memory cell array, the input receiver having a reference voltage input terminal;
   a conductor that electrically couples a reference voltage to the reference voltage input terminal; and
   a capacitor connected between the conductor and a first common reference voltage.

2. An integrated circuit memory device as recited in claim 1, wherein a location of the connection between the capacitor and the conductor is selected in accordance with electrical characteristics of the input receiver.

3. An integrated circuit memory device as recited in claim 1, further comprising:
   a plurality of input receivers each having a reference voltage input terminal, the conductor electrically coupling the reference voltage input terminals to the reference voltage.

4. An integrated circuit memory device as recited in claim 3, further comprising:
   a plurality of capacitors respectively connected between the plurality of reference voltage input terminals and the first common reference voltage.

5. An integrated circuit memory device as recited in claim 1, further comprising:
   a delay locked loop circuit that is responsive to a first clock signal and generates a second clock signal having a predetermined duty cycle, the input receiver being responsive to the second clock signal.

6. An integrated circuit memory device as recited in claim 5, wherein the predetermined duty cycle is about 50%.

7. An integrated circuit memory device as recited in claim 1, wherein the input receiver is connected to a second common reference voltage, the second common reference voltage having a magnitude that exhibits greater variability than a magnitude of the first common reference voltage.

8. An integrated circuit memory device as recited in claim 7, wherein the first and second common reference voltages are provided from sources external to the integrated circuit memory device.

9. An integrated circuit memory device as recited in claim 1, wherein the input receiver comprises:
   a level shifter that is responsive to an input data signal and the reference voltage; and
   a static cell that is responsive to the level shifter and generates an output data signal at a logic level opposite that of the input data signal.

10. An integrated circuit memory device as recited in claim 9, further comprising:
    an amplifier; and
    a capacitance fixing circuit coupled to the amplifier, the amplifier and the capacitance fixing circuit coupling the level shifter to the static cell.

11. An integrated circuit memory device as recited in claim 9, wherein the level shifter comprises a differential comparator circuit.

12. An integrated circuit memory device as recited in claim 9, wherein the input data signal and the reference voltage are provided from sources external to the integrated circuit memory device.

13. An integrated circuit memory device as recited in claim 1, wherein the capacitor is a metal oxide semiconductor (MOS) capacitor.

14. An integrated circuit memory device as recited in claim 1, wherein the integrated circuit memory device is a Rambus dynamic random access memory (RDRAM) device.

15. An integrated circuit memory device, comprising:
    a plurality of input receivers each having a reference voltage input terminal;
    a conductor that electrically couples the reference voltage input terminals to a reference voltage;
    a metal oxide semiconductor (MOS) capacitor having a gate terminal connected to the conductor and drain and source terminals connected to a first common reference voltage; and
    a delay locked loop circuit that is responsive to a first clock signal and the first common reference voltage and generates a second clock signal having a predetermined duty cycle, each of the plurality of input receivers being responsive to the second clock signal.

16. An integrated circuit memory device as recited in claim 15, wherein each of the plurality of input receivers is connected to a second common reference voltage, the second common reference voltage having a magnitude that exhibits greater variability than a magnitude of the first common reference voltage.

17. An integrated circuit memory device as recited in claim 16, wherein the first and second common reference voltages are provided from sources external to the integrated circuit memory device.

18. An integrated circuit memory device as recited in claim 15, further comprising:
    a plurality of MOS capacitors respectively connected between the plurality of reference voltage input terminals and the first common reference voltage.

19. An integrated circuit memory device as recited in claim 15, wherein a location of the connection between the gate terminal of the MOS capacitor and the conductor is selected in accordance with electrical characteristics of the plurality of input receivers.

20. An integrated circuit memory device as recited in claim 15, wherein the integrated circuit memory device is a Rambus dynamic random access memory (RDRAM) device.

21. An integrated circuit memory device, comprising:
    an input receiver having a reference voltage input terminal;
    a conductor that electrically couples a reference voltage to the reference voltage input terminal;
    a capacitor connected between the conductor and a first common reference voltage; and
    a delay locked loop circuit that is responsive to a first clock signal and generates a second clock signal having a predetermined duty cycle, the input receiver being responsive to the second clock signal.

22. An integrated circuit memory device as recited in claim 21, wherein the predetermined duty cycle is about 50%.

23. An integrated circuit memory device, comprising:
   an input receiver having a reference voltage input terminal, the input receiver comprising:
   a level shifter that is responsive to an input data signal and a reference voltage; and
   a static cell that is responsive to the level shifter and generates an output data signal at a logic level opposite that of the input data signal;
   a conductor that electrically couples the reference voltage to the reference voltage input terminal; and
   a capacitor connected between the conductor and a first common reference voltage.

24. An integrated circuit memory device as recited in claim 23, further comprising:
   an amplifier; and
   a capacitance fixing circuit coupled to the amplifier, the amplifier and the capacitance fixing circuit coupling the level shifter to the static cell.

25. An integrated circuit memory device as recited in claim 23, wherein the level shifter comprises a differential comparator circuit.

26. An integrated circuit memory device as recited in claim 23, wherein the input data signal and the reference voltage are provided from sources external to the integrated circuit memory device.

* * * * *